United States Patent [19]

Shibata et al.

[11] 4,086,535
[45] Apr. 25, 1978

[54] MICROWAVE OSCILLATOR

[75] Inventors: Toshiji Shibata, Toride; Shinji Fujiwara, Moriya, both of Japan

[73] Assignee: Meisei Electric Co. Ltd., Tokyo, Japan

[21] Appl. No.: 692,045

[22] Filed: Jun. 2, 1976

[30] Foreign Application Priority Data

Jun. 6, 1975 Japan .................................. 50-68312

[51] Int. Cl.² .............................................. H04B 1/04
[52] U.S. Cl. ...................................... 325/128; 331/96; 325/105
[58] Field of Search ............... 325/105, 125, 127, 128, 325/129, 130; 331/96, 97, 117 D; 333/83 R

[56] References Cited

U.S. PATENT DOCUMENTS

| | | | |
|---|---|---|---|
| 3,286,194 | 11/1976 | Barkes | 331/97 |
| 3,516,014 | 6/1970 | Hines et al. | 331/117 D |
| 3,576,499 | 4/1971 | Axford et al. | 331/117 D |
| 3,599,196 | 8/1971 | Boyko | 331/96 |
| 3,611,146 | 10/1971 | Cooper et al. | 325/125 X |

Primary Examiner—Robert L. Griffin
Assistant Examiner—Jin F. Ng
Attorney, Agent, or Firm—Toren, McGeady and Stanger

[57] ABSTRACT

The present invention relates to a microwave oscillator to be applied to radiosonde. The microwave oscillator in accordance with the present invention is constructed on a plane base plate of dielectric material (insulation material) on whose both sides conductor sheets are provided. The resonance circuit, which is the most important part of the microwave oscillator, is mounted fixedly on the one side of the base plate and electrically connected to the conductor sheet provided on the other side of the base plate. The element for determining the resonance frequency of this resonance circuit assumes a three dimensional form, whereby two bent conductor plates are combined into a case shaped body, whose one side is constructionally and electrically connected to the conductor sheet provided on the one side of the base plate.

The transistor, which is an active element of the resonance circuit, is constructionally and electrically connected to a part of the case shaped metal body.

The circuit elements for forming the oscillator circuit, such as resistors, the condensers and the transistor and so on are mounted on the other side of the base plate.

18 Claims, 15 Drawing Figures

MICROWAVE OSCILLATOR

BACKGROUND OF THE INVENTION

As one of the routine works in the weather observation, various kinds of the weather elements such as the wind direction, the wind velocity, the temperature, the humidity, the atmospheric pressure and so on at each altitude from the ground up to the upper air are measured by means of an observation instrument provided hanging below the balloon freed in the air, whereby the signals (electrical codes) representing the results of the measurement are sent to a receiving station on the ground by means of a microwave. It is known that such a transmitter as hangs below the balloon is called radiosonde.

It is essential for a radiosonde to operate since the balloon with the radiosonde is freed on the ground (the sea) till it reaches the altitude of about 30 km, whereby the ambient conditions, being quite different from the ambient condition for our life on the ground, are remarkably severe, for example, the temperature covering from $+40°$ C $\sim -80°$ C, the atmospheric pressure covering from 1040 mb - 1 mb and the humidity covering from 1 % - 100 %, the radiosonde itself being subject to the vibration and the shock during the flight.

Further it is difficult to recover the radiosonde after the flight is over so that it is expendable.

From the above mentioned reasons it is required that the instruments for a radiosonde should be compact, light, cheap and stable in the characteristics even under the above mentioned severe physical and chemical ambient conditions over a wide range.

On the other hand, the time interval during which the characteristics should be stable is at longest several hours, till the termination of one flight observation.

In consequence it is necessary to manufacture the microwave oscillator for radiosonde, taking into consideration the requests quite different from those for the microwave oscillator used for the stationary transmitting station on the ground.

In case of radiosonde, so far the frequency from 1.6 GHz - 2 GHz has been used internationally, whereby as oscillation active element for the above mentioned frequency band a vacuum tube of special shape, so called penciltube has been used, while quite recently it is tried to substitute the above mentioned oscillation active element with what makes use of a transistor (generally a semi-conductive element) in view of the above mentioned various requests.

So far several simple microwave oscillator with a transistor suited for radiosonde covering from 1.6 GHz to 2 GHz have already been proposed.

FIG. 1 shows a circuit diagram of a representative microwave oscillator which has been proposed. In case of the microwave oscillator with the circuit as is shown in FIG. 1, the part shown with a figure L in the drawing is composed a two dimensional micro-stripline formed with a conductor sheet on a dielectric body (insulation body). Although the construction of an oscillator using a micro-stripline on the base plate of a dielectric material is simple, it is essential that the loss in the microwave band of the material for the base plate be small while its temperature characteristics is superior. A base plate of dielectric material which fulfills the above mentioned characteristics is so expensive that it is not desirable to apply such an expensive material to the microwave oscillator of radiosonde, article of consumption.

Apart from the above as an oscillator with stable oscillation frequency, there is an oscillation circuit consisting of a coaxial resonator and a semi-conductor element. However, in case of an oscillator with coaxial resonator it is essential to improve the characteristics of the coaxial resonator, whereby the construction is complicated so that it is not suited for radiosonde due to the larger dimension, the higher price and the larger weight.

The present invention is made in consideration of the above mentioned various problems.

A purpose of the present invention is to offer a compact and light microwave oscillator suited for a radiosonde.

Another purpose of the present invention is to offer a microwave oscillator consisting of a cheap and conventional base plate material and suited for a radiosonde.

Further another purpose of the present invention is to offer a microwave oscillator consisting of cheap and conventional materials beside the base plate and suited for a radiosonde.

Further another purpose of the present invention is to offer a microwave oscillator which is capable of keeping the necessary characteristics for the observation of the weather element under the severe ambient conditions during the flight of the radiosonde.

Further another purpose of the present invention is to offer a microwave oscillator which can be manufactured so easily as to contribute much to reduce the price of radiosonde.

Further another purpose of the present invention is to offer a consumable microwave oscillator suited for radiosonde.

SUMMARY OF THE INVENTION

The present invention is characterized in that on both surfaces of the base plate of the ordinary dielectric material (insulation material) printed conductor sheets are formed and that on both surfaces the circuit elements composing a microwave oscillator are provided, and electrically connected to each other.

The present invention is further characterized in that one of the conductor sheets provided on both surfaces of the base plate forms the wiring pattern of the electric circuit forming an oscillation circuit, while one part of the pattern has mounted thereon a three dimensional element serving as a resonator and described as a resonance circuit below. The is mounted whereby the resonance circuit is electrically connected to the pattern.

The present invention is further characterized in that the other of the conductor sheets provided on both surfaces of the base plate serves as a part of the element having an effective function of a ground-plane type antenna, serving at the same time as the part on which the circuit elements forming and oscillation circuit are mounted.

The present invention is further characterized in that in an embodiment the printed conductor sheet serving as a part of the ground-plane type antenna is provided totally over the one surface of the base plate in a two dimensional and continuous way.

The present invention is further characterized in that in another embodiment the printed conductor sheet serving as a part of the ground-plane type antenna is formed partially on the one surface of the base plate.

The present invention is further characterized in that the printed conductor sheet serving as a part of the ground-plane type antenna and provided totally on the one surface of the base plate is partially covered with the circuit elements for forming an oscillation circuit excepting the resonance circuit such as the resistors, the condensers, the transistors and so on, which circuit elements are provided sparsely.

The present invention is further characterized in that the printed conductor sheet partially provided on the one surface of the base plate and serving as a part of the ground-plane type antenna is covered with the circuit elements for forming the oscillation circuit excepting the resonance circuit only on the spots, on which those circuit elements are positioned, whereby the covering elements are provided sparsely.

The present invention is further characterized in that two metal pieces are respectively bent into an external case and an internal case, which are formed as one body into an open case shaped three dimensional body whereby the one surface of the external case is connected in close contact with the one surface of the internal case in such a manner that the external case is electrically connected with the internal case through the closely connected part so as to form a resonance circuit, which circuit is mounted on and electrically connected with the electrical circuit pattern conductor sheet formed on the one surface of the base plate.

The present invention is further characterized in that in the three dimensional resonance circuit and at the middle position of the height of the resonance circuit the conductor plate electrically made as one body with the case with a free end is projected parallel to the base plate.

The present invention is further characterized in that in one embodiment the free end projecting inside of the case is bent upwards at right angle to the base plate in such a manner that a small gap is formed between the free end and the surface of the external case perpendicular to the base plate.

The present invention is further characterized in that in another embodiment the free end projecting inside of the case is bent downwards perpendicular to the base plate in such a manner that a small gap is formed between the free end and the external case perpendicular to the base plate.

The present invention is further characterized in that by means of adjusting the distance of the gap formed between the free end perpendicular to the base plate and the surface of the external case perpendicular to the base plate the oscillation frequency is set at a desired value.

The present invention is further characterized in that opposed to the surface parallel to the base plate, of the free end of the conductor plate projecting at the middle position in the case a conductor rod electrically connected to the earth conductor is provided.

The present invention is further characterized in that the end of the earth conductor projecting opposed to the free end of the conductor plate projecting at the middle position in the case is provided movable to and fro toward the end of the projecting conductor plate in such a manner that by means of adjusting the distance between the end of the projecting conductor plate and the end of the earth conductor rod the oscillation frequency is adjusted at a desired value.

The present invention is further characterized in that on the free end of the conductor plate projecting at the middle position in the case a small conductor piece is mounted with an intermediary dielectric body.

The present invention is further characterized in that by means of adjusting the position of the semi-fixed small conductor piece mounted on the free end of the conductor plate projecting at the middle position in the case with an intermediary dielectric body the oscillation power is kept at a desired value.

The present invention is further characterized in that in one embodiment the case shaped body consisting of combined metal pieces for forming a resonance circuit is an open case shaped body in such a manner that the five surfaces out of the six for forming a cubic body in the mounted state on the base plate exist while the sixth surface is missing.

The present invention is further characterized in that in another embodiment the case shaped body consisting of combined metal pieces for forming a resonance circuit is an almost or half closed case shaped body, presenting six surfaces in the mounted state on the base plate.

The present invention is further characterized in that on a part connected as one body with the resonance circuit outside of the case shaped metal body for forming the resonance circuit an oscillation active transistor is mounted.

The present invention is further characterized in that in one embodiment the oscillation active transistor is of the so called can-type, whereby the collector is connected to the external casing.

The present invention is further characterized in that in another embodiment the oscillation active transistor is of the type with the collector insulated from the external casing.

The present invention is further characterized in that on a metal piece connected as one body with the metal member of the resonance circuit and standing up on the base plate outside of the resonance circuit a transistor of the type with the collector connected to the external casing is mounted.

The present invention is characterized in that on a metal piece connected as one body with the resonance circuit and formed in close contact with the base plate outside of the resonance circuit a transistor of the type with the collector insulated from the external casing.

The present invention is further characterized in that the part holding a transistor of the type with the collector connected to the external casing and being connected as one body with the resonance circuit presents electrically a high frequency impendance, being so designed as to radiate the heat produced by the transistor.

The present invention is further characterized in that the part holding a transistor of the type with the collector insulated from the external casing and being connected as one body with the resonance circuit does not present a high frequency impedance, but is designed so as to radiate the heat produced by the transistor.

The present invention is further characterized in that the collector of a transistor of the type with the collector insulated from the external casing is connected to the part holding the transistor firmly and being connected as one body with the resonance circuit, with an intermediary of a corresponding length of an impedance lead.

The present invention is further characterized in that outside of the open case shaped resonance circuit the oscillation active transistor of the type with the collector connected to the external casing is supported on a metal piece formed as one body with the metal member of the resonance circuit and standing up on the base plate.

The present invention is further characterized in that outside of the closed case shaped resonance circuit an oscillation active transistor of the type with the collector connected to the external casing is supported on a part connected as one body with the resonance circuit and standing up on the base plate.

The present invention is further characterized in that outside of the open case shaped resonance circuit an oscillation active transistor of the type with the collector insulated from the external casing is supported on a part connected as one body with the resonance circuit and fixed in close contact with the base plate.

The present invention is further characterized in that outside of the close case shaped resonance circuit an oscillation active transistor of the type with the collector insulated from the external casing is supported on a part connected as one body with the resonance circuit and fixed in close contact with the base plate.

The present invention is further characterized in that a needle shaped conductor member is connected to the oscillation active transistor, whereby the needle shaped conductor member penetrate the center of the base plate in such a manner that the needle shaped conductor member stand up on the other side of the base plate perpendicular thereto so as to serve as antenna.

The present invention is further characterized in that the needle shaped conductor member projecting from the center of the base plate perpendicular thereto and the printed conductor sheet provided on the surface of the base plate from which surface the needle shaped conductor member projects carrying out a function of ground-plane type antenna acting in mutual effect.

BRIEF DESCRIPTION OF THE DRAWINGS

FIG. 2 shows a three dimensional resonance circuit and a base plate on which the three dimensional resonance circuit is mounted in perspective view.

FIG. 3 is an exploded perspective view of several portions of the resonance circuit.

FIG. 4 shows a front side section of the three dimensional resonance circuit and the base plate on which the three dimensional resonance circuit is mounted.

FIG. 5 shows a right side section of the three dimensional resonance circuit and the base plate on which the three dimensional resonance circuit is mounted.

FIG. 6 shows an equivalent circuit of the three dimensional circuit shown in FIGS. 2, 4 and 5.

FIG. 7 shows a circuit diagram of an embodiment of the microwave oscillation circuit.

FIG. 8 shows an equivalent circuit of the embodiment of the microwave oscillation circuit shown in FIG. 7.

FIG. 9 shows a front view of an embodiment of the microwave oscillation circuit designed for a radiosonde.

FIG. 10 shows a bottom view of the oscillation circuit shown in FIG. 9.

FIG. 11 shows a diagram for showing the characteristics of the oscillation frequency and the output power of the microwave oscillation circuit for a radiosonde.

FIG. 12 shows another embodiment of the three dimensional circuit and the base plate on which the three dimensional circuit is mounted in perspective view.

FIG. 13 shows a front side section of the three dimensional resonance circuit and the base plate on which the three dimensional circuit is mounted.

FIG. 14 shows a right side section of the three dimensional resonance circuit and the base plate on which the three dimensional circuit is mounted.

FIG. 15 shows a bottom view of the oscillation circuit.

DESCRIPTION OF PREFERRED EMBODIMENTS

Figure 2:
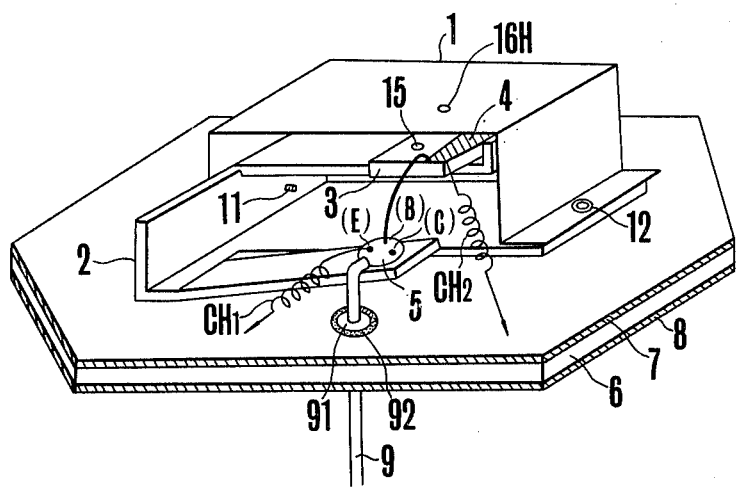
FIGS. 2 to 15 respectively show an embodiment of the present invention, whereby.
Figure 3:
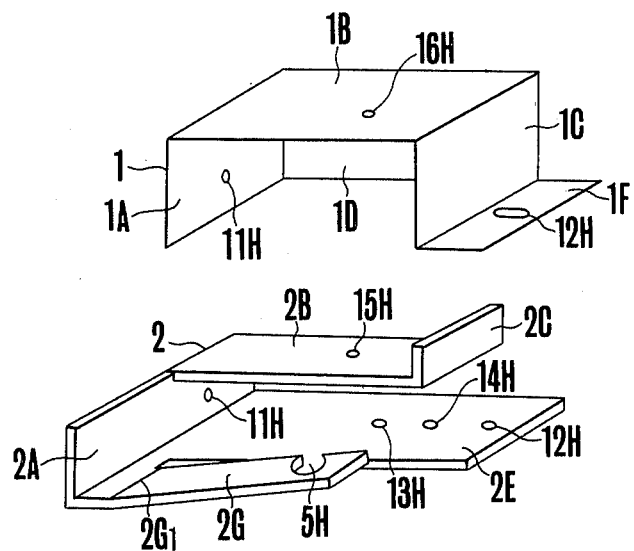

The resonance circuit which forms the most important part of the oscillator in accordance with the present invention is a three dimensional circuit as is shown in FIG. 2, while FIG. 3 shows the elements forming this resonance circuit, namely the metal plates 1 and 2. FIGS. 2 and 3 are both perspective views seen along the same directions.

As is shown in FIG. 3, the general shape of the metal plate 1 is like a flat case, among of whose six side planes the adjacent two planes are missing, whereby the lower part of one of the vertical planes is bent outside almost at the right angle. On the other hand, the general shape of the metal plate 2 is like an open C-shaped case, when seen from the front side, presenting only three planes, when seen from the front side, whereby the upper plane of this side is missing, while the end of the remaining part being bent upwards. The lower plane is divided into two parts, namely the part of this side (the part directed to the left and downwards in FIG. 3) and the part of that side (the part directed to the right and upwards in FIG. 3), whereby the part of that side is opposed to the upper plane, being extended longer than the upper plane while the part of this side is bent at the foot upwards along the near edge of the part at that side.

As is shown in FIG. 2, the metal plate 1 is inserted into the metal plate 2 with the same direction relation as is shown in FIG. 3. Although in FIG. 3, the metal plate 2 is shown with thickness while the metal plate 1 is shown without thickness, whereby it goes without saying that the metal plate 1 also presents the thickness.

Further detailed arrangement of the metal plates 1 and 2, will be explained below together with the electrical situation between them. Hereby for the sake of simplicity of the explanation the metal plates 1 and 2 shown in FIG. 3 are provided with the following figures; namely the metal plates 1 presents on each plane the combinations of 1 and A, B, C, D and F, while the metal plate 2 presents the combination of 2 and A, B, C, E and G in such a manner that when the metal plate 2 is inserted into the metal plate 1 the parts presenting the same alphabet coincide with each other or parallelly opposed to each other.

Further, in FIG. 3 the metal plates 1 and 2 present such figures as 11H, 12H, 13H and 14H, which indicate holes through which the screw 11, 12, 13 and 14 are inserted. 5H is a recess for mounting the transistor 5. Further 2G1 shows the position at which the plane 2G of the metal plate 2 is bent so as to stand up from the base plate 6. The hole 16H for adjustment is provided for the driver for securing the screw 15. This hole is provided in accordance with necessity whereby the size depends upon the necessity.

Figures 4, 5:
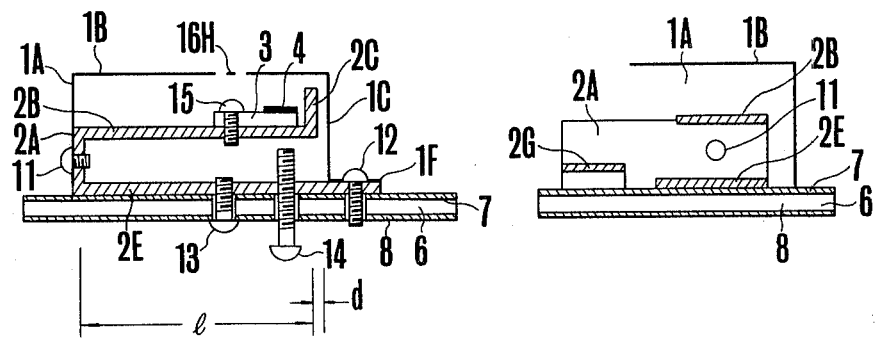

The combination of the metal plates 1 and 2 will be explained in accordance with FIGS. 4 and 5. FIG. 4 shows a section of the element shown in FIG. 2 along the line along which the screw holes 12H, 14H, 13H and 11H are provided on the plane 2E of the metal plate. 15 is a screw. FIG. 5 shows a section of the plane 1B, of the metal plate 1 and the planes 2B, 2E and 2G of the metal plate 2 along the plane 1C of the metal plate 1, seen from the side of the plane 1C.

The metal plate 1 and the metal plate 2 are fixed by means of a screw 11 in such a manner that the plane 1A of the metal plate 1 comes in close contact with the plane 2A of the metal plate 2, while the plane 1F of the metal plate 1 is put in close contact with the plane 2E of the metal plate 2, being secured by means of a screw 12. Then the plane 2E of the metal plate 2 is put in close contact with the conductor sheet 7 formed on the upper surfaces of the base plate 6, being secured by means of a screw 13. Hereby an adjusting screw 14 is provided in such a manner that the screw goes through the base plate 6 and the plate 2E of the metal plate 2 so as to be in electrical contact with the plane 2E.

Further a small strip of the dielectric body 3 is provided at the end of the plane 2B of the metal plate 2, whereby a comparatively small (and thin) conductor plate 4 with small area is laid on the dielectric body 3, being secured by means of a screw 15. The end of the plane 2B is a free end, namely the end of the plane 2C, which is the foremost end of the plane 2C does not reach the upper plane 1B.

The gap formed between the planes 2C and 1C and that formed between the end of the plane 2B and the end of the conductor rod 14 are small.

The plane 2B of the metal plate 2 is placed between the plane 1B of the metal plate 1 and the plane 2E of the metal plate 2 parallelly to both planes 2B and 2E whereby the distance between the planes 1B and 2B is chosen equal to the distance between the planes 2E and 2B.

As is understood from FIGS. 2, 4 and 5 the bent metal plate 2 with superior conductivity is covered by means of the bent metal plate 1 also with superior conductivity, whereby the plane 1B of the metal plate 1, the planes 2B and 2E of the metal plate 2 are parallel to each other, while the planes 2B and 2E are positioned below the plane 1B of the metal plate 1 and the plane 2G is positioned outside of the metal plate 1.

In case of such a construction the plane 2B is the central conductor while the planes 2E and 1B are the earth conductors so as to compose a three dimensional circuit equivalent to the strip line whereby the circuit is short circuited through the planes 1A and 2A. The end of the plane 2B composing the central conductor is bent upwards at the right angle into a free end and the plane 2C parallel to the vertical plane 1C in such a manner that between the planes 2C and 1C a capacity $C_1$ is formed.

The outside of the metal plate 1 is bent into the plane 1F, which is secured on the plane 2E of the metal plate 2 by means of a screw 12, whereby by forming the screw hole 12H as long circle the gap between the planes 1C and 2C can be adjusted to some extent at the time of fixing the plane 1F on the plane 2E. The value of the electrostatic capacity $C_1$ can be varied by changing this gap $d$.

By means of rotating the adjusting screw 14 whose end is brought near the plane 2B (the free end of the plane 2B) whereby between the screw 14 and the plane 2B working as middle conductor an electrostatic capacity $C_2$ is formed. This screw 14 is electrically connected to the earth conductor 2E so that between the free end of the middle conductor 2B and the earth conductor 2E an electrostatic capacity $C_2$ is formed, whereby the value of the electrostatic capacity C2 can be varied by bringing the end of the screw 14 close to or away from the plane 2B. The smaller the diameter is, the finer adjustment of the electrostatic capacity C2 can be realized with the same pitch.

Figure 6:
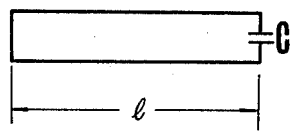

As is shown in FIG. 6 in case of the electrically equivalent circuit of the three dimensional circuit thus composed two parallel lines with length $l$ are short circuited at the one end while an electrostatic capacity $C = (C_1 + C_2)$ is connected to the other end so as to form a resonance circuit consisting of the impedance of the parts with length $l$ and the electrostatic capacity C connected to the ends. The resonance frequency of this resonance circuit can be varied by varying the electrostatic capacity $C_1$ or $C_2$ so that a set adjusting can be carried out. The length l shown in FIG. 6 corresponds with the distance from the $C_1$ plane side of the plane 2C of the metal plate to the 1C plane side of the plane 2A of the metal plate 2. Further d shown in FIG. 4 is the gap distance formed between the plane 1C of the metal plate 1 and the plane 2C of the metal plate 2.

Further the free end of the plane 2B of the metal plate 2 as middle conductor, namely the dielectric body 3 mounted near the plane 2C and the conductor 4 on the dielectric body 3 forms an electrostatic capacity $C_3$ toward the plane 2B of the conductor. Hereby at the time of mounting the dielectric body 3 on the plane 2B, by so designing the construction that the conductive plate 4 is mounted on the plane 2B of the conductor with the intermediary of a dielectric body 3 in a half fixed way in such a manner that the dielectric body 3 is movable on the plane 2B around the screw 15 or slidable straight along the plane 2C when the screw is loosened, it is possible to vary the area of the conductive plate 4 opposed to the plane 2B of the central conductor so that the electrostatic capacity $C_3$ can be set and adjusted as variable. Hereby, the conductive plate 4 is fixed on the dielectric body 3 without being brought in contact with the screw 15. The electrostatic capacity C3 could also be adjusted by means of further another embodiment. The electrostatic capacity $C_3$ has the effect for determining the feed back amount of the oscillation so that the oscillation output can be adjusted to some extent by adjusting this electrostatic capacity $C_3$. Even with a small electrostatic capacity $C_3$ the oscillation can be kept.

Exactly speaking by means of adjusting the value of the electrostatic capacity $C_3$ not only the oscillation power but also the oscillation frequency are changed whereby the variation of the oscillation frequency is remarkably small as compared with the variation obtained by adjusting the electrostatic capacities $C_1$ or $C_2$ so that there is no practical problem, whereby further the deviation of the oscillation frequency beyond the determined value due to the electrostatic capacity $C_3$ can be corrected easily by means of the adjustment of the electrostatic capacitors $C_1$ and $C_2$.

The vital part of the microwave oscillation circuit can be composed by combining the resonance circuit whose equivalent circuit is shown in FIG. 6, the electrostatic capacity $C_3$ and an active element such as transistor.

FIG. 2 shows an embodiment of the essential part of a microwave oscillator with a transistor for microwave of the so called can-type in which the collector is connected to the case. Further in FIG. 2 the base (B) of the transistor 5 is connected to the conductor plate 4 composing the electrostatic capacity $C_3$, the collector (C) of the transistor 5 is connected to the plane 2G of the metal plate 2, the choke coil $CH_1$ is connected to the emitter (E) of the transistor 5 and the choke coil $CH_2$ is connected to the conductive plate 4 (base (B)), whereby the bias current is supplied to the emitter (E) and the base (B) through the choke coil $CH_1$ and the choke coil $CH_2$.

The outer casing of the transistor 5 is supported by the metal plate 2C, being put in the hole or recess 5H near the end of the plane 2G of the metal plate 2 while the plane 2G rises gradiently apart from the conductor sheet 7 in such a manner that the heat produced in the transistor 5 is led outside through the plane 2E of the earth conductor and the conductor sheet 7 while the plane 2G is formed narrow in such a manner that there is no ohmic resistance but an impedance to the microwave band.

It is not always necessary for the plane 2G to be provided parallely to the edge line of this side of the plane 2B so far as the plane 2G is placed apart from the part working as resonance circuit in view of the high frequency. Fig 2 shows the construction of the parallel arrangement.

The output power of oscillation is taken out by connecting the antena 9 to the collector (C) of the transistor 5. Namely, the one end of the antenna 9 is directly connected to the collector (C) (casing), while the other end goes through the conductor sheets 7 and 8 so as to project downwards on the base plate 6, serving as one of the element for radiating the oscillation output in the space.

In the part of the base plate 6 through which the antenna 9 goes, the conductor sheets 7 and 8 (formed for example with the printed copper sheet) are electrically connected to each other by means of the metal pipe 92, whereby the inside of the metal pipe 92 is filled with a cylindrical insulator (spacer) 91, whose center holds the needle shaped (slender) antenna 9 going through the insulator 91.

Figure 7:
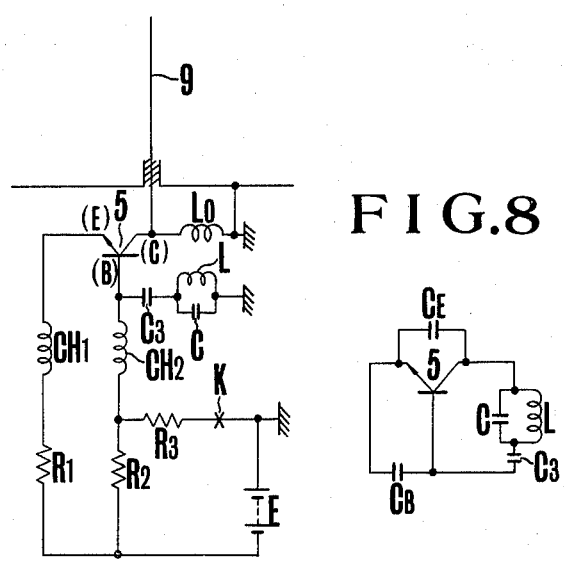

The microwave oscillation circuit as is shown in the circuit shown in FIG. 7 consists of the resonance circuit and the active element as explained above. In FIG. 7, 5, $CH_1$, $CH_2$. C and $C_3$ are the same elements described above, while L is the impedance of the parallel conductor with length l in the equivalent circuit shown in FIG. 6, Lo the high frequency impedance of the plane 2G of the metal plate 2, $R_1$, $R_2$ and $R_3$ the resistors, K the key for delivering the measurement information, and E the direct current source, whereby the key K is composed by the part of the electronic circuit in practice but is shown equivalently in the drawing.

Figure 8:
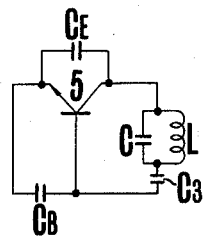

FIG. 8 shows a high frequency equivalent circuit of the circuit of FIG. 7. In the drawing, L, C, $C_3$ and 5 are the same elements as used in the preceeding drawings. CE and CB are respectively the effective electrostatic capacity between the collector and the emitter and that between the base and the emitter of the transistor 5.

An embodiment of the metal plate 1 and of the metal plates 2 for producing 1680 MHz normally used for radiosonde is so designed that as the metal plate 1 a silver-plated, 0.3 mm thick brass plate and as the metal plate 2 a silver-plated, 1 mm thickness brass plate is used, while the width of the plane 2B of the metal plate 2 is chosen 8 mm, the length (l) 25 mm, the distance between the plane 1B of the metal plate 1 and the plane 2B of the metal plate 2, 4 mm, the distance between the planes 2B and the 2E of the metal plate 2, 4 mm and the gap between the plane 1C of the metal plate 1 and the plane 2C of the metal plate 2 very small. Further the plane 1B of the metal plate 1 and the plane 2E of the metal plate 2 are formed nearly same as the plane 2B in view of dimension. The plane 2G of the metal plate are formed for example, 5 mm × 25 mm × 1 mm (thickness).

The approximate dimension of the dielectric body 3 is 8 mm × 10 mm × 1.6 mm (thickness) while it is sufficient that the dimension of the conductor plate 4 be nearly a half of the above or smaller, whereby the adjusting screw 14 of 2 mm$\phi$ for producing the electrostatic capacity $C_2$ is sufficient.

To speak more generally, so far as the surface of the member forming the three dimensional resonance oscillator is coated with a superior conductive material, it is not necessary to limit the internal material to the brass plate, while so far as the material of the part holding the oscillation active transistor has a superior heat conductivity, it is not necessary to limit the internal material to the brass plate.

Figure 9:
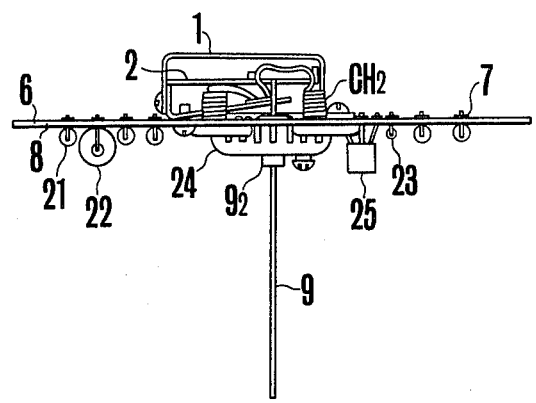
Figure 10:
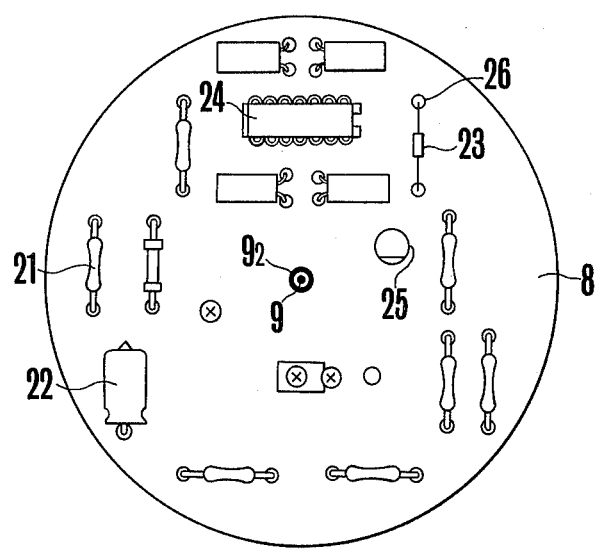

FIGS. 9 and 10 show an embodiment of the circuit shown in FIG. 7, consisting the resonance circuit, the active element, the resistors, the condensors and so on. In FIGS. 9 and 10, 21 is a resistor, 22 a condensor, 23 a diode, 24 an I.C. chip, and 25 a transistor but not the one 5 mentioned above. FIGS. 9 and 10 show the resistor, the condensor, the transistor and the I.C. chip and so on for providing combined figures for the observation are arranged on the same base plate 6 on which the component forming the circuit shown in FIG. 6 are also arranged. The circuit shown in FIG. 2 corresponds with the resonance circuit and others shown in perspective view in the central part of the circuit shown in FIGS. 9 and 10.

In the embodiment shown in FIGS. 9 and 10, the conductors are led through the holes perforated through the base plate 6 from one surface to the other so as to be connected to the conductor sheet 7 on the one side of the base plate on whose other side the components are provided. The conductor sheet 7 is etched in such a manner that only the pattern parts (including the part to be connected to the earth conductor 2E of the metal plate 2) remains. The conductor sheet 8 on the side of the base plate on which side the components are provided continuously in two-dimension over the whole surface of the base plate, excepting the small parts shown with 26 in FIG. 10, for example, 2 mm – 5 mm around the holes.

Hereby the two-dimensional, continuous arrangement of the printed conductor sheet means that the printed conductor sheet is arranged fully and continuously in all directions in the plane whereby there is no place in which no printed conductor sheet exists (excepting the small space around the holes for the leads), while the straight or the crooked arrangement of the wire-shaped printed conductor sheet with width can not be said two dimensional and continuous here. In case at least in the central part of the base plate 6 there is a space in which no printed conductor sheet exists or the wire shaped printed conductor sheet with width is arranged or crooked, the printed conductor sheet is said to be partially provided in the explanation to be made later.

Namely, although it is tried that the leads of the parts should not come in short circuit with the conductor sheet, several parts are positioned sparsely on the conductor sheet 8 so as to cover only the portions corresponding to the shadow area of the parts on the plane. Hereby, for example, the insulation of the resistors and so on is inferior excepting the leads so that in case of necessity the principal part of the parts is provided with the insulation mantle so as to prevent the electrical contact of other parts than leads with the conductor sheet 8. Hereby the printed conductor sheet 8 is electrically connected to the three dimensional resonance circuit provided on the other side of the plane than the one on which the printed conductor sheet 8 is provided or to the printed conductor sheet 7 electrically connected to the three dimensional resonance circuit (hereby "electrically" means "conductive with respect to the high frequency").

Hereby as is shown in FIGS. 9 and 10, the base plate 6 is shaped circular. This circular shape has been chosen according to one of the practical necessity for the ground plane type antenna of a radiosonde, whereby the shape being made use of in the present invention the radius of this circular disc is chosen about one fourth of the oscillation wave length so that also the shape of the conductor sheet 8 fully provided all over the one side of the base plate 6 is of circular disc with radius corresponding to one fourth of the oscillation wave length while the length of the antenna 9 standing at the center of the conductor sheet 8 at right angle is also chosen about one fourth of the oscillation wave length. The conductor sheet 8 serves as one of the radiation member, whereby an antenna of the effectively groundplane type is composed of the conductor sheet 8 and the antenna 9. Further it has been confirmed that there takes place practically no such influence as disturbs the characteristics of this groundplane type antenna even if the parts are provided sparsely on the conductor sheet 8 fully stretched in a plane with large area.

Generally it is not always necessary that the dimensions of the base plate 6 should correspond with the radius of the printed conductor sheet 8, whereby the base plate can be of such dimension as present the portion not covered with the printed conductor sheet outside of the portion covered with the conductor sheet 8, namely the radius being larger than one fourth of the wave length. Further various parts can be mounted on the portion not covered with the printed conductor sheet in accordance with necessity.

Further generally there takes place no problem even if the circuit members are mounted on the same side of the base plate that is provided with the resonance circuit consisting of the metal plates 1 and 2.

Figure 11:
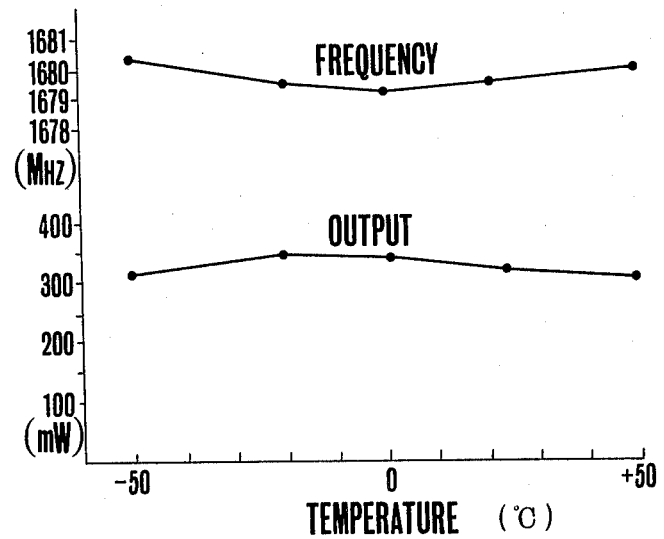

FIG. 11 shows an example of the characteristics of oscillation circuit composed as mentioned above. In FIG. 11, the abscissa shows the temperature (the ambient temperature of the space in which the present oscillation circuit is used), while the ordinate shows the oscillation frequency in the upper part and the oscillation power (the antenna output) in the lower part so as to use the abscissa commonly for two kinds of the ordinate. As can be understood from the diagrams shown in FIG. 11 the operation is remarkably stable and satisfactory in view of the oscillation frequency as well as the oscillation power over such a wide range of temperature covering from $-50°$ C to $+50°$ C.

According to the experiments it has been confirmed that the oscillation frequency can be adjustedly varied at least by $\pm 80$ MHz by means of the electrostatic capacity $C_1$ and $C_2$. In this case, it is further possible to adjust the oscillation frequency over a wider range by means of adjusting the electrostatic capacity $C_3$ at the same time.

Figure 12:
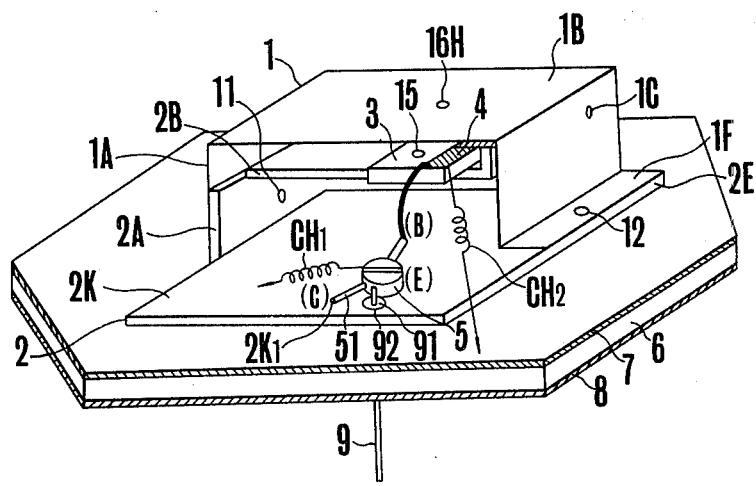

FIG. 12 shows another embodiment of the metal plate 2 than that shown in FIGS. 2 and 3. In case of the present embodiment the metal plate 1 is composed in the same way as in case of the embodiment shown in FIGS. 2 and 3, while the part corresponding to the plane 2G for holding the transistor 5 in case of the embodiment shown in FIG. 2 is projecting from the plane 2E inside of the metal plate 1 to the outside of the plate 1 in case of the embodiment shown in FIG. 12, so as to be connected with the portion named plane 2K in FIG. 12. In other words, in case of the embodiment shown in FIG. 12, the earth conductor cemented on the conductor sheet 7 is not divided as is shown in FIGS. 2 and 3. Such structure as that of the metal plate 2 is suited to the application in the microwave transistor whose collector is insulated from the case. The elements presenting other figures than 2K are respectively equivalent to those shown with the same figures in FIG. 2.

In case of the embodiment shown in FIG. 12, the transistor 5 is fixed on the portion 2K projecting outside of the metal plate 1, while the collector (C) of the transistor 5 is electrically connected to a point (shown with $2K_1$ in FIG. 12) on the plane 2K by means of a lead 51 with some length. This collector connecting lead 51 presents some impedance in the microwave band in the same way as the plane 2G in case of FIG. 2 does so as to correspond with Lo in the circuit shown in FIG. 7 in its effect. In case of the embodiment shown in FIG. 12, the transistor 5 is positioned on the plane 2K separated from the plane 1B of the metal plate 1 and the plane 2B of the metal plate 2 working as a resonance circuit in the meaning of the high frequency in the same way as in case of the embodiment shown in FIG. 2. Further in the present case, the antenna 9 is branched directly from the collector (C) of the transistor 5, without the intermediary of the lead 51 in the same way as is shown in FIG. 9. Further in the embodiment shown in FIG. 12, the portion around the part 2K on which the transistor 5 is mounted serves as the heat radiation plate for radiating the head produced by the transistor 5.

Further as is shown in FIG. 12, on both sides of the base plate 6 respectively the conductor sheet 7 and the conductor sheet 8 are formed, whereby the plane 2E of the metal plate 2 is fixed in close contact with the conductor sheet 7 in the same way as is shown in FIG. 2. Hereby the embodiment shown in FIG. 12 can be mounted as is shown in FIGS. 9 and 10 in the same way as the embodiment shown in FIG. 2 is mounted as is shown in FIGS. 9 and 10. In this case, the relation between the plane 2B as the middle conductor and the plane 2E as the earth conductor, that between the plane 2B as the middle conductor and the plane 1B as the earth conductor, that between the planes 2C and 1C, that between the plane 2B on the one side and the dielectric body 3 and the conductor plate 4 on the other side, that between the antenna 9 and the conductor sheets 7 and 8 and so on are equivalent to the embodiment shown in FIG. 2. Further the resonance circuit shown in FIG. 6, the microwave oscillation circuit shown in FIG. 7 and the equivalent circuit shown in FIG. 8 are equivalently effective in the embodiment shown in FIG. 12, whereby the operation characteristics is also equivalent to that shown in FIG. 11.

Figure 13:
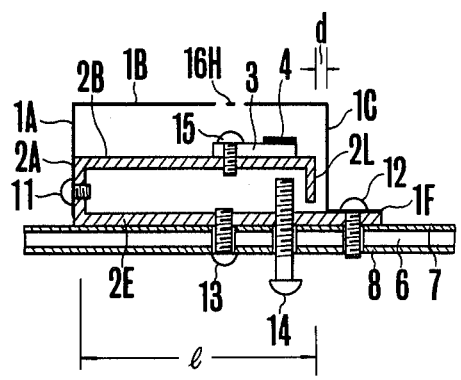

Not only in the embodiment shown in FIG. 2 but also in the embodiment shown in FIG. 12 the same effect in accordance with the present invention can be obtained even if the plane 2C at the end of the metal plate 2 is bent downwards from the plane 2B at the right angle so as to be parallel to the plane 1C as is shown in FIG. 13. In this case also the end of the plane 2B is a free end and therefore tha plane 2C does not reach the plane 2E.

Further in the embodiments shown in FIG. 2 as well as FIG. 12 the oscillation output is directly taken out from the collector of the transistor 5, whereby in both embodiments the metal plate 1 covers the four sides (the five sides are covered, when the plane 2E of the metal plate 2 is taken into consideration), in such a manner that the radiation energy is shielded along the direction along which there metal plates exist so that the current supply to the antenna 9 is of high efficiency.

Figure 14:
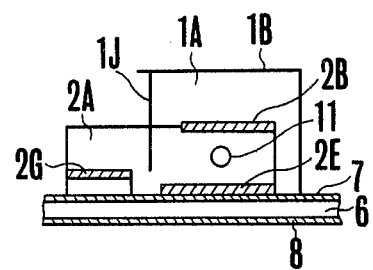

Hereby the current supply efficiency is all the more improved and the radiation energy is all the more stronger in case a part of the embodiment shown in FIG. 2 is modified in such a manner that the open side of the metal plate 1 (the side at which the transistor 5 is mounted) is shielded by means of a metal plane 1J electrically connected to the metal plate 1 in the same way as in case of the embodiment shown in FIG. 14. In FIG. 14, the plane 1J does not reach the plane 2E, while it goes without saying that the plane 1J reaches the plane 2E whereby the more portion is covered, the better efficiency is obtained.

The portion on which the oscillation active transistor is fixed in the embodiment shown in FIG. 14 corresponds with that of the embodiment shown in FIG. 5, consequently in FIG. 2, whereby also in the embodiment shown in FIG. 12, the front side of the plane 1B of the metal plate 1 is covered by means of the metal plate 1J so as to compare a resonance circuit whereby the radiation efficiency is much improved.

Figure 15:
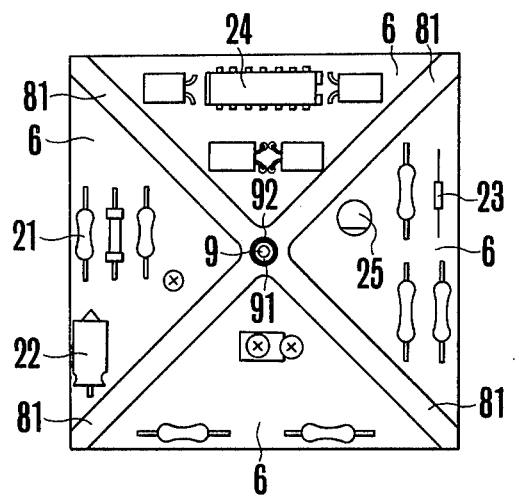

Although FIG. 10 shows the base plate 6 in circular shape, generally the base plate 6 need not be limited to the circular shape. FIG. 15 shows an embodiment with the base plate 6 in square shape. The members with the figures 6, 9, 91, 92, 21, 22, 23, 24, 25 and 26 in FIG. 15 correspond to those with the same figures in FIGS. 9 and 10. FIG. 15 shows the bottom view of the embodiment, whereby the front view almost corresponds with that shown in FIG. 9.

The difference between the embodiment shown in FIG. 15 and that shown in FIG. 10 is that in case of the embodiment shown in FIG. 15 the printed conductor sheet 81 provided on the base plate 6 is stretched radially from the portion at which the antenna 9 is provided along the four directions at right angle while in case of the embodiment shown in FIG. 10 the printed conductor sheet 8 is fully provided all over the one side of the base plate 6. Further in case of the embodiment shown in FIG. 15 the length of each of the four radial printed conductor sheets 81 corresponds with about one fourth of the wave length, whereby the conductor sheet composes an effective ground plane type antenna together with the antenna with the length corresponding to one fourth of the wave length.

Further in case of the embodiment shown in FIG. 15 the members such as the resistor 21, the condenser 22, the diode 23, the I.C. chip 24, the transistor 25 (not the oscillation active are mentioned above) and so on are mounted on the portion of the base plate on which portion no printed conductor sheet 81 is provided. In consequence in case of the embodiment shown in FIG. 15 there takes place no problem as to the insulation from the very beginning while in case of the embodiments shown in FIGS. 9 and 10 some counter-measure is needed because there is a possibility for the short-circuit or the inferior insulation between the lead for the parts (the parts proper under some circumstances) and the printed conductor sheet 8.

The dimension of the base plate 6 is smaller in case of the embodiment shown in FIG. 15 than in case of the embodiment shown in FIG. 9. Consequently the area of the material can be economized for the base plate, while it is much more economic to cut square shaped pieces than the circular pieces out of the raw material.

Further in the same way as in case of the embodiment shown in FIG. 9, also in case of the embodiment shown in FIG. 15 it is possible to provide a portion not covered by the printed conductor sheet outside of the portion of the printed conductor sheet 81 on the base plate 6, namely outside of the portion forming the effective ground-plane type antenna, in such a manner that the parts are mounted in the portion.

Further as a variation of the embodiment shown in FIG. 15, three printed conductor sheets 81 is stretched radially from the center along the three directions at 120° to each other, whereby a ground-plane type antenna with the same efficiency as that shown in FIG. 15 can be obtained. In this case, the base plate can be shaped as a triangle so far as the portion necessary for mounting the parts are available, whereby in the same way as in case of the printed conductor sheet 81 the portion not covered with the conductor sheet can be enlarged beyond the outside of the portion on the base plate covered with the conductor sheet while the shape need not be triangle because the portion provided with the conductor sheet is triangle.

Further in FIG. 15, the conductor sheets 81 composing a ground-plane type antenna are straight and provided diametrically in view of the antenna 9 as center, whereby it is not always necessary that the conductor sheets 81 should be straight, and the conductor sheets 81 can be bent or crooked, while it is not always necessary that the strict symmetricity should be maintained in every parts, and the conductor sheet 81 can be provided at the roughly balanced positions with the roughly balanced area and pattern over a wide range in such a manner that an efficiency sufficient for the practical application can be obtained, small deviations being disregarded.

Generally the circumferencial shape of the base plate, whether the conductor sheet formed on the one side of the base plate serving as a part of the ground-plane type antenna should fully cover all over the surface in two dimensional and continuous way, the concrete pattern of the conductor sheet when the base plate is fully covered, whether the parts cover the conductor sheet no matter whether the base plate is covered fully or partially (whereby it is essential that the parts are provided sparsely on the conductor sheet), whether the circumferencial shape of the base plate is equal or proportional to that of the conductor sheet no matter whether the base plate is covered fully or partially and whether there exists any portion not covered with the conductor sheet outside of the conductor sheet no matter whether the conductor sheet is provided fully in two dimensional and continuous way or partially are all the conditions to be established independently in such a manner that any embodiment can be obtained out of the combination of the different and various conditions.

The one side 2E of the external conductor explained above in accordance with FIG. 2 is electrically identical with the conductor sheet 7 stretched on the base plate 6 as the earth conductor, whereby as for as the means for supporting the transistor 5 is technically solved (the construction of the plane 2G shown in FIG. 2 as supporter and element for high frequency impedance), it is not necessary that the shape of the metal plates 1 and 2 should be such as shown in FIG. 3 and above mentioned means can be compared with the element of any optional shape so far as it looks like a (almost) completely closed case or a case which is opened at most at one side. For example, the conductor sheet 7 itself can be applied on the plane 2E. This can be applied also for the embodiment shown in FIG. 12.

In order to apply the radiosonde for observation, a switching operation element consisting transistors and other popular semi-conductor members are used as the key K shown in FIG. 7. This switching operation element is realized by means of for example, the transistor of the blocking-oscillation circuit while the oscillation period of this blocking-oscillation circuit is determined by means of the result of the measurement of various weather phenomena such as temperature, humidity and atmospheric pressure and so on whereby the circuit is so designed that the key K shown in FIG. 7 repeats the switching on and off in such a manner that the repetition number in a period during which the key K is off represents the value of each weather phenomenon (hereby the output of the microwave signal is null when the key K is off and therefore what is to be observed is the repetition number in a period during which the output of the microwave signal is null). Further it is convenient that the time interval during which the output of the microwave signal is null should be considerably small.

The transistor 5 explained in accordance with every embodiment can be either a single one or the one combined with the circuit of other function by means of I.C. chip.

Figure 1:
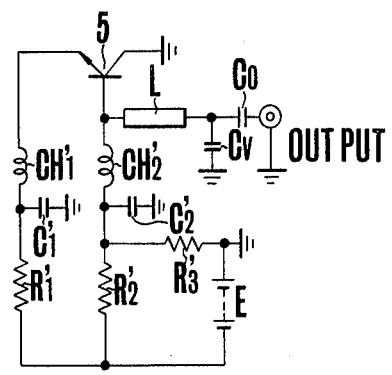
FIG. 1 shows a circuit diagram of the conventional microwave oscillator.

The microwave oscillator as explained above, in accordance with the present invention offers the following merits when it is used as a compact oscillator for radiosonde.

a. The oscillator can be composed of the conventional cheap members and materials. Further the dielectric material for fixing the central conductor and the earth conductor to each other is available not so expensive as is used for the ordinary microwave oscillator, so that there takes place no dielectric loss for the electromagnetic wave while the characteristics of the dielectric material is not influenced by the variation of the temperature and further the weight is smaller than the conventional one by the weight of the dielectric material.

b. The oscillation frequency can be adjusted remarkably easily by adjusting the distance between the two metal plates or that between the earth conductor and the metal plates while no expensive variable condensor with small dielectric loss for the ordinary microwave band is used so that there takes place no dielectric loss nor the frequency change due to the temperature fluctuation.

c. It is possible to carry out a fine adjustment of the electrostatic capacity which is one of the conditions for determining the oscillation frequency and therefore it is possible to carry out the fine adjustment of the oscillation frequency easily.

d. It is possible to adjust the oscillation power easily within a certain range by slightly deviating the conductor plate placed on the central conductor plate with the intermediary of the dielectric material.

e. The middle conductor is positioned just in the middle between the upper and the lower earth conductor in such a manner that the impedance between the middle conductor and the upper earth conductor is nearly equal to that between the middle conductor and the lower earth conductor so that in case the middle conductor is translated up and down due to the vibration or the shock the deviation of the impedance between the middle conductor and the upper earth conductor is equal to that of the impedance between the middle conductor and the lower earth conductor in the absolute value but contrary in the symbol and therefore the deviation of the composed impedance is practically very small so that the influence of the vibration or the shock given while the observation ballon with this microwave oscillator is flying in the air is practically very small.

f. The gap between the bent free end of the central conductor and the outside earth conductor is nearly equal from top to bottom of the bent end, so that even if the free end of the middle conductor is deviated up and down due to the vibration and the shock by outside phenomena, the deviation of the electrostatic capacity due to the deviation of these gaps is so small that the influence upon the oscillation frequency due to the vibration or the shock by outside phenomena is considerably small.

g. The earth conductors are L-shaped or C-shaped in their profil while the middle conductors and the earth conductors are fixed on the base plate, combined as one body so that the strength is kept sufficiently large against the force along the base plate surface.

h. The earth conductors are cover-shaped or case-shaped so as to include the middle conductor inside so that the radiation of the electromagnetic wave from the middle conductor to outwards is prohibited, then the deviation of the oscillation frequency due to the deviation of the ambient conditions is very small.

i. The antenna (the principal primary radiation element) is directly connected to the output point of the oscillation operating element, then there is no feeder to the current supply point so that there takes place no loss due to the mis-matching.

j. The antenna is directly connected to the collector of the transistor so as to take out the oscillation output while the resonance circuit for determining the oscillation frequency is connected to the base circuit through a very fine capacity, the antenna being not directly connected to the resonance circuit, so that the ratio of the deviation of the oscillation frequency due to the deviation of the ambient conditions to the antenna is smaller in the system in accordance with the present invention than that as is shown in FIG. 1, whereby the oscillation output is taken out from part of the resonance circuit.

k. The resonance circuit for determining the oscillation frequency is connected to the base through a very fine capacity so that the influence of the deviation of the stray capacity existing in the base circuit due to the fluctuation of the voltage, the temperature and so on upon the resonance circuit is very small, whereby the deviation amount of the oscillation frequency due to the voltage deviation is $\frac{1}{2} - \frac{1}{3}$ as small as that of the embodiment shown in FIG. 1, whereby the resonance circuit consisting of the strip line and the capacity is directly connected to the base of the transistor.

l. The oscillation active element is provided at the position independent of the resonance circuit for determining the oscillation frequency in the meaning of high frequency so that the oscillation frequency is stable.

m. The points for adjusting the oscillation frequency, the oscillation output and so on are all on the same electrical potential (the earth potential in the meaning of the direct current) (only the conductor plate 4 in the embodiments is independent of the external construction in the meaning of the direct current), so that even if during the adjustment a driver or the like should come into contact with such points by mistake, there would take place no electrical damage for the oscillation active element (transistor).

n. The member for carrying out the effect of the antenna in practive is made use of as the base plate for mounting the circuit elements so that in comparison with the conventional system in which the antenna member and the circuit member mounting member are the different members, not only the space efficiency in the meaning of the construction but also the antenna output efficiency in the meaning of the characteristics are superior, whereby the effective characteristics of the antenna is not influenced even when the circuit members are arranged sparsely.

o. The oscillation transistor is mounted on a metal plate exposed to the outside so that the radiation of the produced heat is carried out efficiently.

p. It is sufficient to use only a small amount of the members which as a whole are light in the weight, not an especially expensive members are not needed, and not a special process is needed for the manufacture the assembling and the adjustment so that compact and light circuit can be obtained economically by the routine operation, being quite suited to the appliances to be consumed and mounted in the flying objects.

As explained above, the microwave oscillator in accordance with the present invention excells in the temperature characteristics, the anti-vibration characteristics and the anti-shock characteristics and further are compact, light and cheap so as to be fitted to the application for the radiosonde. Further apart from the radiosonde which flies high up in the air so as to carry out the observation as is explained at the beginning, there is another one according to the purpose which is kept flying in a comparatively low part of the air by means of a wire fixed on the ground in order to carry out the observation of the weather conditions, the state of gas contained in the air and other atmospheric elements there, whereby also the object in accordance with the present invention can be applied.

Although so far the object is explained as the microwave oscillator for radiosonde, it is not denied that the microwave oscillator in accordance with the present invention can be applied to other purposes than radiosonde. Further as to the material, the process, the frequency and so on so far explained, it is not denied that generally other materials, processes, frequencies than those so far explained can be applid in case the object of the present invention is applied to other purposes than radiosonde.

What is claimed is:

1. A microwave oscillator, comprising a resonance circuit, an active element, other circuit members and a base plate characterized in that the resonance circuit is a three dimensional case shaped body mounted on the base plate and having a plurality of surfaces that inside the three dimensional body a member projects from a surface of the three dimensional body parallel to the base plate, one end of the member being free and extending perpendicular to the projection direction of the member and parallel to a second surface of the three dimensional body, that the surfaces of the three dimensional body as well as the projecting member inside of the three dimensional body and the free end of the projecting member are conductive that one surface of the base plate includes a first conductor extending along the base plate surface, that one conductive surface of the three dimensional body forms a second conductor which is electrically connected with the first conductor, that a conductor rod penetrates the base plate as well as the first conductor and the second conductor, and that the end of the conductor rod opposes the member projecting inside of the three dimensional body.

2. An oscillator as in claim 1, characterized in that the resonance circuit includes first and second conductive portions, that the first conductive portion forms four planes three of which have one side connected to three sides of the fourth plane, that the second conductive portion forms three planes two of which have one side connected to the two opposite sides of the third plane, that one plane of the first conductive portion is in electrical contact which one plane of the second conductive portion so as to form an open case shaped body with five planes whereby the one plane of the second conductive portion forms the member having a free end projecting inside of the body.

3. An oscillator as in claim 1, characterized in that the resonance dircuit comprises first and the second conductive portions, that the first conductive portion forms five planes four of which each have one side connected to the four sides of the fifth plane while the second conductive portion forms three planes two of which each have one side connected to the two opposite sides of the third plane, that one plane of the first conductive portion is connected in close electrical contact with one plane of the second conductive portion so as to form a case shaped body with six planes whereby the one plane of the second conductive portion forms the member having a free end projecting into the body and the first conductor forms one of the five planes.

4. An oscillator as in claim 1, characterized in that the member projecting inside of the three dimensional body for forming the resonance circuit is arranged at the middle position between the upper surface of the three dimensional body and the surface in close contact with the base plate of the three dimensional body.

5. An oscillator as in claim 1, characterized in that in the neighborhood of the end of the member projecting inside of the three dimensional body for forming the resonance circuit said second surface of the three dimensional body is electrically connected with the base plate, and means are provided on said body so that the distance between said second surface and the end of the member can be varied and adjusted.

6. An oscillator as in claim 1, in which a dielectric material is mounted at the end of the member projecting inside of the three dimensional body, and a conductive piece is semi-fixedly mounted on the dielectric material for forming the resonance circuit.

7. A microwave oscillator comprising a resonance circuit, an active element, and a base plate characterized in that the resonance circuit is a three dimensional body having surfaces and mounted on the base plate, that inside of the three dimensional body a member projects from one of the surfaces, and along the direction of the base plate that the end of the member is free and opposed to a second surface, of the three dimensional body, that the member has surfaces, the surfaces of the three dimensional body and that the surfaces of the member inside of the three dimensional body are conductive, that the base plate has conductive surfaces, further characterized in that in the neighborhood of the end of the member projecting inside of the three dimensional body for forming the resonance circuit, said second surface of the three dimensional body is electrically connected to the base plate, and means are proviid on the three dimensional body so that the distance between the second surface; and the end of the member can be varied and adjusted.

8. A microwave oscillator comprising a resonance circuit, an active element, other members and a base plate characterized the resonance circuit is a three dimensional body having surfaces and mounted on the base plate, that in the inside of the three dimensional body a member projects from one of the surfaces, that the end of the member is free and opposed to another surface of the three dimensional body, the member has surfaces, that the surfaces of the three dimensional body and the member inside of the three dimensional body are conductive, that the base plate has conductive surfaces, further characterized in that an oscillation active element is mounted outside of the three dimensional body at a part integral with the three dimensional body and at the same electrical potential to a conductive surface of the base plate, that the oscillation active element includes an external casing and a signal output electrode isolated from the external casing, that an impedance lead connected to the signal output electrode of the oscillation active element is connected to the part integral with the three dimensional body.

9. A microwave oscillator, comprising a resonance circuit, an active element, other circuit member and a base plate having two sides characterized in that the resonance circuit is a three dimensional body, that an active element is mounted outside of the resonance circuit on a prolonged part integrally connected with the resonance circuit, that said element includes a signal output electrode, that an antenna element is connected to the electrode and projects from one side of the base plate in such a manner that the antenna element stands up on the other side of the base plate, and that a conductor for forming a part of the antenna effectively extends over the other surface of the base plate, on which other surface the antenna element is projecting.

10. A microwave oscillator in accordance with claim 9, in which the conductor extending over the base plate as part of the effective antenna is fully spread over the other surface of the base plate.

11. A microwave oscillator in accodance with claim 10, in which circuit members are spaced over the conductor extending over the base plate and provided as part of the effective antenna.

12. A microwave oscillator in accordance with claim 9, in which at the part of the base plate on which the conductor extends as a part of the effective antenna includes a part not covered with the conductor.

13. A microwave oscillator in accordance with claim 12, in which circuit members are sparsely distributed over the conductor forming a part of the effective antenna.

14. A microwave oscillator comprising a resonance circuit, an active element, other circuit members and a base plate characterized in that the resonance circuit is a three dimensional case shaped body mounted on the base plate and having a plurality of surfaces, that inside of the three dimensional body a member projects from a surface of the three dimensional body parallel to the base plate, that the end of the member is free and opposes another surface of the three dimensional body, that the member and the free end has surfaces, that the surfaces of the three dimensional body as well as the projecting member inside of the three dimensional body and the free end of the projecting member are conductive, that the surface of the base plate includes a conductor extending on the surface, that one surface of the three dimensional body is electrically connected with said conductor on the surface of the base plate, that said resonance circuit includes an oscillatory active element outside of the three dimensional body, that a part of the three dimensional body is at the same electrical potential as said conductor of the base plate, that the oscillation active element has a signal output electrode connected to the external case mounted on a conductor member with a high frequency impedance.

15. A microwave oscillator comprising a resonance circuit, an active element, other circuit members and a base plate, characterized in that the resonance circuit is a three dimensional case shaped body mounted on the base plate and having a plurality of walls, that inside the three dimensional body a member projects from a wall and extends parallel to the base plate, that the end of the member is free and opposes another wall of the three dimensional body, that the three dimensional body and the base plate as well as the projecting member and the free end of the projecting member are conductive, that the one surface of the base plate forms a conductor extending along the surface, that one surface of the three dimensional body is electrically connected with said conductor, that the resonance circuit includes an oscillation active element mounted outside of the three dimensional body and on a structure integrally extending from the body and electrically connected to the three dimensional body and at the same electrical potential as said conductor on the surface of the base plate, that said active element has a signal output electrode insulated from the body, that an impedance lead is connected from the signal output electrode of the oscillation active element to a part of said conductor connected integrally with the outside of the three dimensional body.

16. A microwave oscillator comprising a resonance circuit, an active element, other circuit members and a base plate characterized in that the resonance circuit is a three dimensional case shaped body mounted on the base plate and having a plurality of walls that inside the three dimensional body a member projects from a wall and extends parallel to the base plate, that the end of the member is free and opposed to another wall of the three dimensional body, that the three dimensional body as well as the projecting member inside of the three dimensional body and the free end of the projecting member have conductive surfaces, that the base plate includes a surface having a first conductor extending therealong, that one surface of the three dimensional body is electrically connected with the first conductor, that a conductor rod penetrates the base plate, that a surface of said body forms a second conductor, that the first conductor and said second conductor are electrically connected, that the top end of the conductor rod popposes a part of the free end of the member porjecting inside of the three dimensional body, and that the distance between the end of the conductor rod and the free end of the projecting member in the inside of the three dimensional body is variable and adjustable.

17. An oscillator as in claim 16, in which the conductor rod is a screw member having a conductive surface.

18. A microwave oscillator comprising a resonance circuit, an active element, other circuit members and a base plate characterized in that the resonance circuit is a three dimensional case shaped body mounted on the base plate and having a plurality of walls, that inside the three dimensional body a member projects from a wall and extends parallel to the base plate, that the end of the member is free and perpendicular to the projection direction of the member and parallel to a second wall of the three dimensional body, that the three dimensional body and the base plate as well as the projecting member inside of the three dimensional body and the free end of the projecting member have conductive surfaces, that one surface of the base plate forms a conductor extending there along, that one surface of the three dimensional body is electrically connected with the conductor on the surface of the base plate, that and means are provided on said three dimensional body so the distance between the free end of the member projecting in the inside of the three dimensional body and the second wall of the three dimensional body is variable and adjustable.

* * * * *